(12) United States Patent
Liu et al.

(10) Patent No.: US 8,829,505 B2
(45) Date of Patent: Sep. 9, 2014

(54) ORGANIC LIGHT-EMITTING DIODE STRUCTURE AND DISPLAY DEVICE THEREOF

(75) Inventors: Yawei Liu, Guangdong (CN);
Yuan-Chun Wu, Guangdong (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 191 days.

(21) Appl. No.: 13/639,074

(22) PCT Filed: Aug. 9, 2012

(86) PCT No.: PCT/CN2012/079859
§ 371 (c)(1),
(2), (4) Date: Oct. 2, 2012

(87) PCT Pub. No.: WO2014/008700
PCT Pub. Date: Jan. 16, 2014

(65) Prior Publication Data
US 2014/0014906 A1   Jan. 16, 2014

(30) Foreign Application Priority Data

Jul. 10, 2012 (CN) .......................... 2012 1 0237373

(51) Int. Cl.
*H01L 35/24* (2006.01)
(52) U.S. Cl.
USPC .................................... 257/40; 257/E51.001
(58) Field of Classification Search
USPC ............................................. 257/40, E51.001
See application file for complete search history.

(56) References Cited

U.S. PATENT DOCUMENTS

2012/0236190 A1* 9/2012 Ogasahara et al. ........... 348/302

* cited by examiner

*Primary Examiner* — Anthony Ho
(74) *Attorney, Agent, or Firm* — Kirton McConkie; Evan R. Witt

(57) ABSTRACT

The present invention is provided an organic light emitting diode structure and display device therefor, wherein an organic light emitting diode comprises a transparent substrate; and multi-rowed and multi-columned light emitting pixel units formed on the transparent substrate, which comprising a plurality of light emitting pixels. The organic light emitting diode also comprises ultraviolet light emitting pixels for emitting ultraviolet light. The present invention is caused the OLED display device to carry out colorful display and also can use to be ultraviolet light.

20 Claims, 4 Drawing Sheets

ORGANIC LIGHT-EMITTING DIODE STRUCTURE AND DISPLAY DEVICE THEREOF

FIELD OF THE INVENTION

The present invention relates to a technical field of liquid crystal display, and more particularly to an organic light emitting diode structure and a display device thereof.

BACKGROUND OF THE INVENTION

OLED, i.e. organic light emitting diode, also named "organic electroluminesence display (OELD)", is a new generation of lighting display device, in which organic light materials is filled in a space between a transparent anode and a metal reflective cathode and a voltage can be applied to the organic light materials for lighting. Because OLED doesn't need a backlight device, so that it can be manufactured relatively thin. Compared to other type panel display devices, OLED consumes less electric power, OLED can work within a wider range of temperature, and the manufacturing cost thereof is relatively low. Therefore, its application gradually becomes wider. Furthermore, organic light emitting materials having various colors can carry out various colors in displaying. For example, referring to FIG. 1, FIG. 1 is a schematic view of pixel structures of OLED display device, wherein each of pixel units comprises sub-pixels R, G and B, and sub-pixels R, G and B are used to provide various visible lights, such as red light, green light and blue light.

Moreover, with the development of quartz glass, package techniques, electric vacuum industry and ultraviolet spectrum techniques, ultraviolet lighting are widely utilized day by day, wherein the ultraviolet light comprise mercury arc lamp, metal halide lamp, electodeless discharge lamp, xenon lamp, ultraviolet excimer lamp and ultraviolet (UV) emitting diode. Within ultraviolet lighting, as described above, the most used is gaseous ultraviolet lighting. However, the gaseous ultraviolet lighting have problems that main materials are high toxic, secondary pollution is potential existed and device is inconvenient to use and easy to be broken.

In contrast, an emerging ultraviolet-organic light emitting diode (UV-OLED) has advantages in environmental protection, low-cost, easy large-area production and easy integration to flexible substrate, so as to make up the shortage of the conventional ultraviolet lighting. However, if UV-OLED is separately produced, the usage is not widely enough, and its application is certainly limited.

It is therefore one of directions in OLED researching field to think how to combine OLED display with ultraviolet lighting to form a new OLED display device for carrying out colorful display and being used as an ultraviolet light source.

SUMMARY OF THE INVENTION

An object of the present invention is to provide an organic light emitting diode structure, which is used to form a new type of OLED display device to carry out colorful display and also can be used as an ultraviolet light source.

To achieve the above object, the present invention provides an organic light emitting diode structure which comprises: a transparent substrate; and a plurality of row-arranged and column-arranged light emitting pixel units formed on the transparent substrate, and each of the light emitting pixel units comprising: a first light emitting pixel, a second light emitting pixel and a third light emitting pixel to provide a plurality of visible light, wherein the organic light emitting diode further comprises:

ultraviolet emitting pixels constructed by a first electrode layer, an ultraviolet organic emitting layer and a second electrode layer deposited and stacked on the transparent substrate in turn for emitting ultraviolet light.

In one embodiment of the present invention, the ultraviolet organic light emitting layer is filled with ultraviolet light emitting materials.

In one embodiment of the present invention, ultraviolet light emitting materials are organic compounds of carbazoles, fluorenes, triphenylamines or quinquephenyls.

In one embodiment of the present invention, materials of the transparent substrate are quartz glass or polymethylmethacrylate (PMMA).

In one embodiment of the present invention, each of the light emitting pixel units is corresponding to one of the ultraviolet light emitting pixels, wherein in each of the light emitting pixel units, first light emitting pixel units, second light emitting pixel units and third light emitting pixel units are arranged along a direction of rows, the ultraviolet light emitting pixels are arranged along the same direction of the rows and parallel to the first, second and third light emitting pixels.

In one embodiment of the present invention, each of the light emitting pixel units is corresponding to one of the ultraviolet light emitting pixels; a first light emitting pixel, a second light emitting pixel and a third light emitting pixel in each of the light emitting pixel units and the ultraviolet light emitting pixels form a square array.

In one embodiment of the present invention, the ultraviolet light emitting pixels are parallel to the light emitting pixel units of each row.

In one embodiment of the present invention, the transparent substrate is further formed with scan lines, data lines, power lines and switch array components thereon, the ultraviolet light emitting pixels are connected to the scan lines, the data lines and the power lines through the switch array components, and the ultraviolet light emitting pixels are switched based on signals of the scan lines, the data lines and the power lines.

In one embodiment of the present invention, the organic light emitting diode comprises an ultraviolet power switch components for controlling to switch the ultraviolet light emitting pixels.

Another object of the present invention is to provide an organic light emitting diode structure, which is used to form a new type of OLED display device to carry out colorful display and also can be used as an ultraviolet light source.

To achieve the above advantageous object, the present invention provides an organic light emitting diode structure which comprises: a transparent substrate; and a plurality of row-arranged and column-arranged light emitting pixel units formed on the transparent substrate, and the light emitting pixel units comprising a plurality of light emitting pixels to provide a plurality of visible lights (such as red, green and blue), wherein the organic light emitting diode further comprises: ultraviolet light emitting pixels for emitting ultraviolet light.

In one embodiment of the present invention, the ultraviolet light emitting pixels are constructed by a first electrode layer, an ultraviolet organic emitting layer and a second electrode layer deposited and stacked on the transparent substrate in turn, wherein the ultraviolet organic light emitting layer are filled with ultraviolet light emitting materials.

In one embodiment of the present invention, ultraviolet light emitting materials are organic compounds of carbazoles, fluorenes, triphenylamines or quinquephenyls.

In one embodiment of the present invention, materials of the transparent substrate are quartz glass or polymethylmethacrylate (PMMA).

In one embodiment of the present invention, each of the light emitting pixel units comprises a first light emitting pixel, a second light emitting pixel and a third light emitting pixel, and each of the light emitting pixel units is corresponding to one of the ultraviolet light emitting pixels, wherein in each of the light emitting pixel units, first light emitting pixel units, second light emitting pixel units and third light emitting pixel units are arranged along a direction of rows, the ultraviolet light emitting pixels are arranged along the same direction of the rows and parallel to the first, second and third light emitting pixels.

In one embodiment of the present invention, each of the light emitting pixel units comprises a first light emitting pixel, a second light emitting pixel and a third light emitting pixel, and each of the light emitting pixel units is corresponding to one of the ultraviolet light emitting pixels; the first, second and third light emitting pixels in each of the light emitting pixel units and the ultraviolet light emitting pixels form a square array.

In one embodiment of the present invention, the ultraviolet light emitting pixels are parallel to the light emitting pixel units of each row.

In one embodiment of the present invention, the transparent substrate is further formed with scan lines, data lines, power lines and switch array components thereon, the ultraviolet light emitting pixels are connected to the scan lines, the data lines and the power lines through the switch array components, and the ultraviolet light emitting pixels are switched based on signals of the scan lines, the data lines and the power lines.

In one embodiment of the present invention, the organic light emitting diode comprises an ultraviolet power switch components for controlling to switch the ultraviolet light emitting pixels.

A further object of the present invention is to provide a display device, which is used to form a new type of OLED display device to carry out colorful display and also can be used as an ultraviolet light source.

To achieve the above advantageous object, the present invention forms a display device, wherein the display device comprises an organic light emitting diode structure according to the present invention is provided.

With respect to the conventional techniques, the ultraviolet light emitting pixels and other pixels of the present invention are simultaneously formed in OLED display device, and conjugated to different controlling methods to carry out colorful display or can be used as an ultraviolet light source, so that the function of OLED display device is expanded to increase experiences for users.

For the foregoing context of the present invention is obvious and easy to understand, the further descriptions have particular preferred embodiments according with its figures, as detailed description as followings:

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

Figure 1:
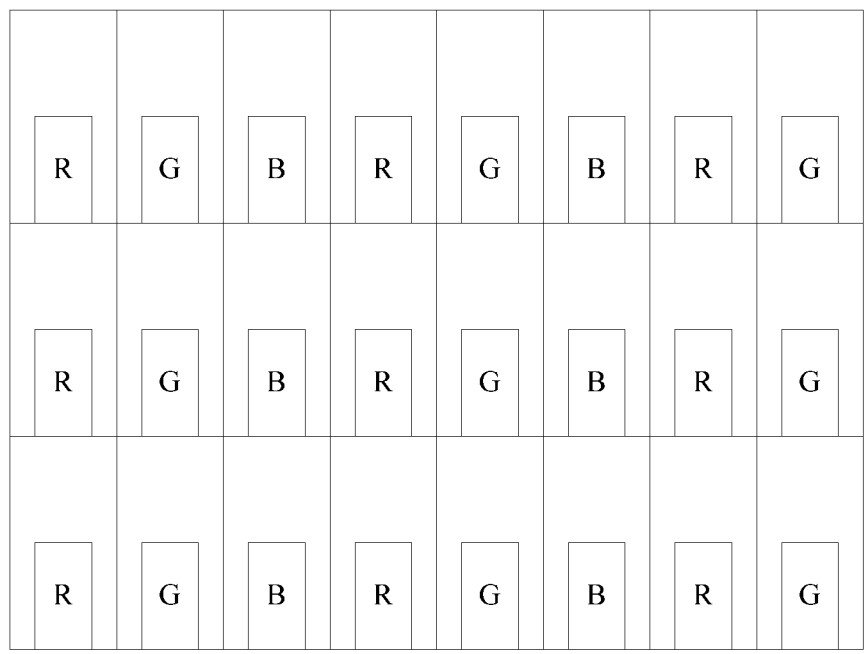
FIG. 1 is a schematic view of a pixel structure of a conventional OLED display device.
Figure 2:
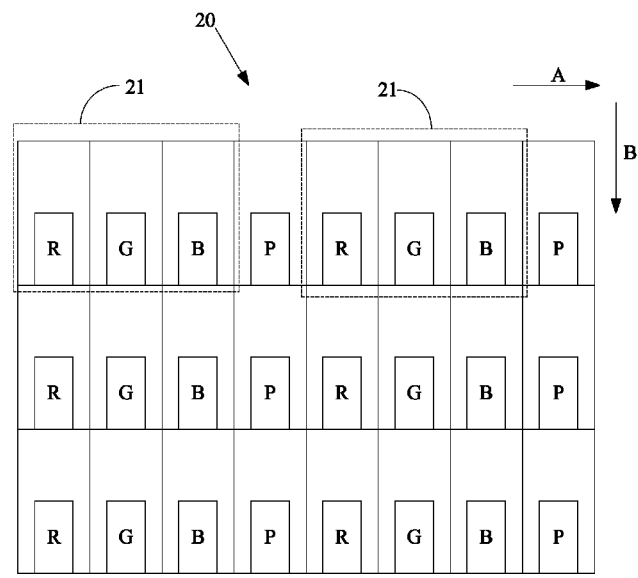
FIG. 2 is a structural schematic view of an organic light emitting diode (OLED) structure according to a first preferred embodiment of the present invention.

FIG. 2 is a structural schematic view of an organic light emitting diode (OLED) structure according to a first preferred embodiment of the present invention.

An OLED display device 20 comprises a plurality of row-arranged and column-arranged light emitting pixel units 21 along a direction of rows A and a direction of columns B, respectively, and each of the light emitting pixel units 21 comprise a first light emitting pixel R, a second light emitting pixel G and a third light emitting pixel B. The light emitting pixels R, G, B, in fact, are a plurality of adjacent OLED circuits used to provide various visible lights (red light, green light, blue light), and can be called "sub-pixels". In some other embodiments, the light emitting pixel units further comprise yellow pigments, that is, the light emitting pixels R, G B and yellow light emitting pixels Y for providing different combination of a plurality of visible lights (such as red light, green light, blue light and yellow light). The OLED display device 20 of the present invention further comprises ultraviolet light emitting pixels P, wherein the ultraviolet light emitting pixels P are used for emitting ultraviolet lights.

Referred still to FIG. 2, each of light emitting pixel units 21 is corresponding to one of ultraviolet light emitting pixels P. In each of light emitting pixel units 21, first, second and third light emitting pixels R, G, B are arranged along a direction of rows A in turn, and the ultraviolet light emitting pixels P are arranged along the same direction of the rows A and parallel to the first, second and third light emitting pixels R, G, B.

Figure 3:
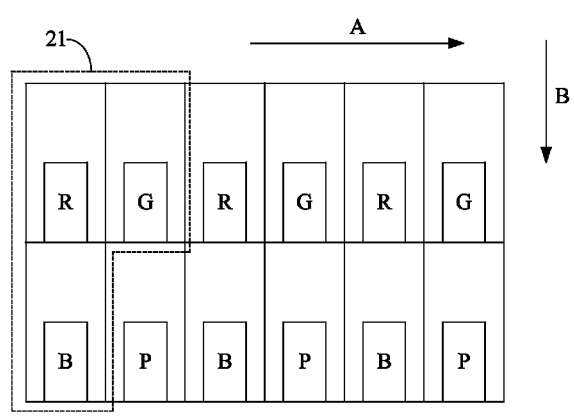
FIG. 3 is a structural schematic view of an organic light emitting diode (OLED) structure according to a second preferred embodiment of the present invention.
Figure 4:
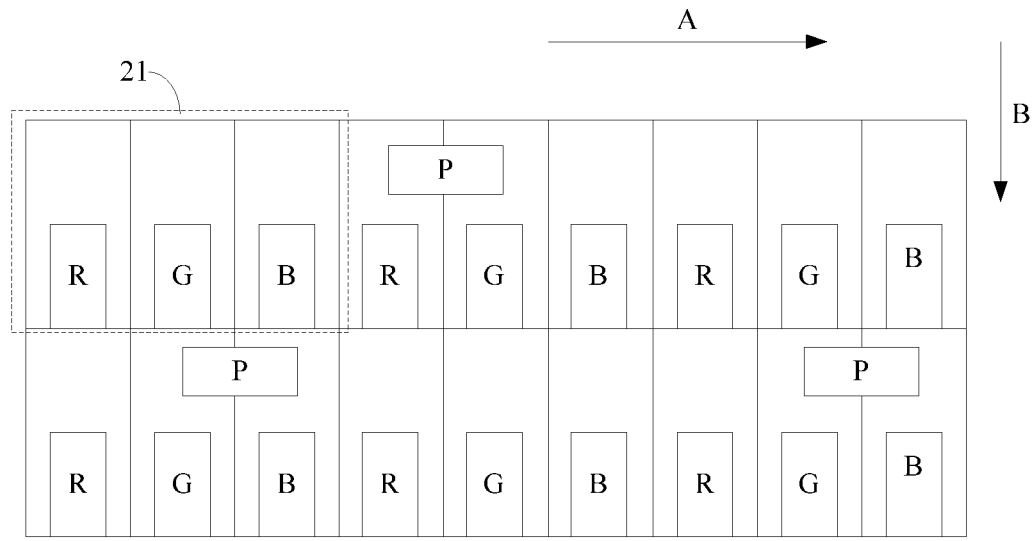
FIG. 4 is a structural schematic view of an organic light emitting diode (OLED) structure according to a third preferred embodiment of the present invention.

In the present invention, the ultraviolet light emitting pixels P and light emitting pixel units 21 further have other arrange methods. For example, referring to FIG. 3, FIG. 3 is a structural schematic view of an organic light emitting diode (OLED) structure according to a second preferred embodiment of the present invention. Compared to FIG. 2 of the first preferred embodiment, the difference is that, in the second preferred embodiment of FIG. 3, the first, second and third light emitting pixels R, G, B and the ultraviolet light emitting pixels P form a square array. Referring to FIG. 4, FIG. 4 is a structural schematic view of an organic light emitting diode (OLED) structure according to a third preferred embodiment of the present invention. The ultraviolet light emitting pixels P are parallel to the light emitting pixel units 21 arranged along the direction of rows A. In FIG. 4, one of light emitting pixel units 21 is corresponding to one of ultraviolet light emitting pixels P, or a plurality of light emitting pixel units 21 are corresponding to one of ultraviolet light emitting pixels P. Certainly, the ultraviolet light emitting pixels P and the light emitting pixel units 21 further have other arrangements which are omitted herein.

Figure 5:
FIG. 5 is a cross-structural view of ultra-violet emitting pixels according to the present invention.

Referring to FIG. 5, FIG. 5 is a cross-structural view of ultra-violet emitting pixels according to the present invention, wherein the ultraviolet light emitting pixels P comprise a transparent substrate 30, wherein the transparent substrate 30 forms a first electrode layer 31 (i.e. positive electrode), a hole transmission layer 32, an ultraviolet organic light emitting layer 33, an electron transmission layer 34 and a second electrode layer 35 (i.e. negative electrode), wherein the first electrode layer 110 can be indium tin oxide (ITO), and the second electrode layer 150 can be magnesium-silver alloy. With a bias condition, electrons of the second electrode layer 35 and holes of the first electrode layer 31 (also named "electron holes") are recombined in the ultraviolet organic light emitting layer 33 to cause the ultraviolet organic light emitting layer 33 emitting ultraviolet light. The ultraviolet light emitted from the ultraviolet organic light layer 33 passes through the hole transmission layer 32, the first electrode layer 31 and the transparent substrate 30 in turn. Because the ultraviolet light emitting pixels P are planar lighting, so that OLED display device is a large-area display ultraviolet lighting device.

In the present invention, the structures of the first, second and third light emitting pixels R, G, B are similar to the ultraviolet light emitting pixels P, for example, the first electrode layer 31, the hole transmission layer 32, the electron transmission layer 34 and the second electrode layer 35 are formed on the transparent substrate 30. The difference is that, in the first, second and third light emitting pixels R, G, B, an organic light emitting layer between the first electrode layer 33 and the second electrode layer 35 are R, G, B materials, respectively.

Furthermore, the ultraviolet organic light emitting layer 34 is filled with ultraviolet light emitting materials, wherein the ultraviolet light emitting materials are preferable selected to be organic compounds of carbazoles, fluorenes, triphenylamines or quinquephenyls.

Referring to Formula (I) hereinafter, Formula (1) is chemical structure of carbazoles used to be ultraviolet light emitting materials. The band gap with carbazoles (the difference of energy is from the lowest point of conduction band to the highest point of valence band) is 3.25 eV, and the peak of emission spectrum is 394 nm Referring to Formula (II), Formula (II) is chemical structure of quinquephenyls used to be ultraviolet light emitting materials, wherein its band gap is 3.48 eV and the peak of emission spectrum is 310 nm. With respect to gaseous ultraviolet lighting of the conventional techniques, the ultraviolet organic light emitting layer 34 formed with ultraviolet light emitting materials of the present invention is solid-state lighting (SSL), so that it is non-toxic to pollute the environments and firmer to use in convenience.

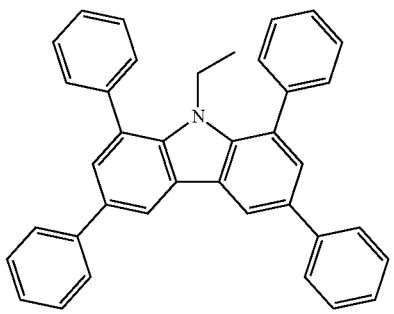

(I)

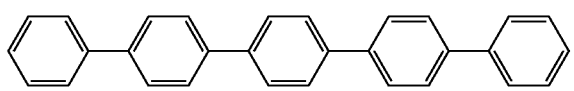

(II)

Materials of the transparent substrate 31 are preferably selected from quartz glass or other transparent materials absorbing ultraviolet light weakly, such as polymethylmethacrylate (PMMA), so as to reduce the absorption of the ultraviolet light from the ultraviolet organic light and further improve the extraction efficiency of ultraviolet light.

Figure 6:
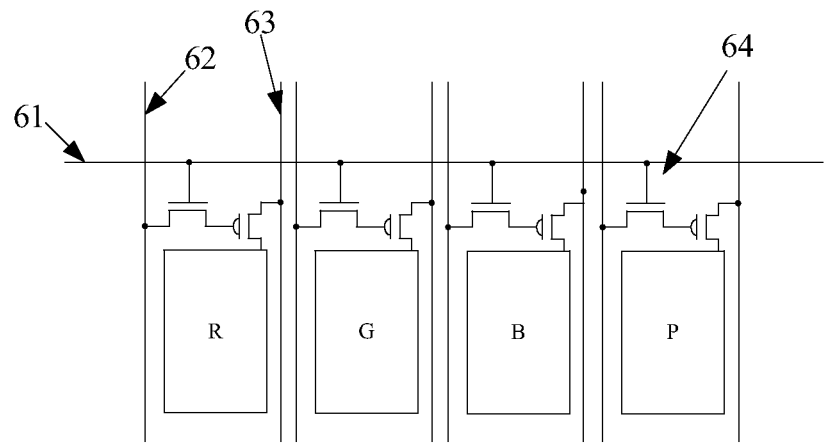
FIG. 6 is a schematic view of a controlling structure for a light emitting pixel unit and an ultraviolet emitting pixel according to the present invention.

Referring to FIG. 6, FIG. 6 is a schematic view of a controlling structure for a light emitting pixel unit and an ultraviolet emitting pixel according to the present invention, wherein the transparent substrate 31 is further formed with scan lines 61, data lines 62, power lines 63 and thin film transistor (TFT) 64. The scan lines 61 and the data lines 62 are crossed and limited to have light emitting pixels R, G, B and ultraviolet light emitting pixels P, and the data lines 62 and power lines are disposed at two sides of the pixels. Each of the light emitting pixels is connected to the scan lines 61, the data lines 62 and power lines 63 through the TFT 64, such as the ultraviolet light emitting pixels P are connected to the scan lines 61, the data lines 62 and the power lines 63 through the TFT 64.

The OLED display device 20 further comprises a driving module, such as gate driver chip and source driver chip (not shown), which are connected to the scan lines 61 and the data line 62, respectively. And, the driving module of the present invention comprises a first driving mode and a second driving mode, wherein the first driving mode is used to drive the first, second and third light emitting pixels R, G, B; and the second driving mode is used to drive the ultraviolet light emitting pixels P. Among them, the first driving mode and the second driving mode are not executed at the same time. Therefore, through the first driving mode, the OLED display device is used to display colorful images, and through the second driving mode, the OLED display device is used to drive the ultraviolet light emitting pixels for emitting ultraviolet light to be an ultraviolet light source.

Figure 7:
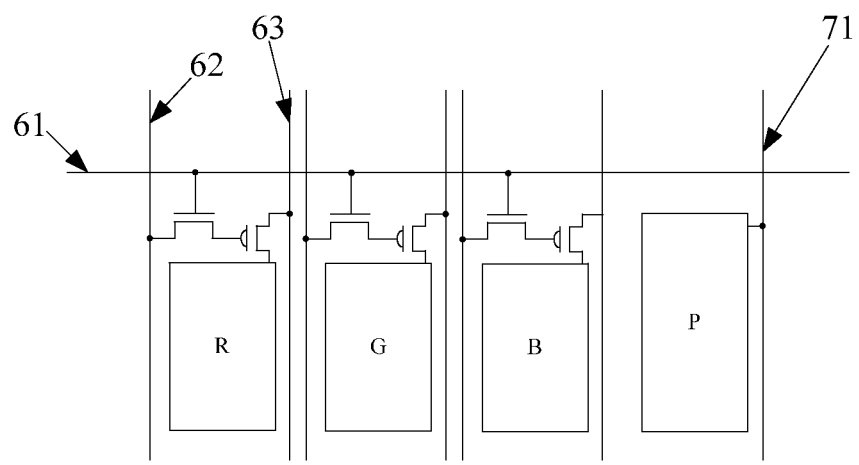
FIG. 7 is another schematic view of a controlling structure for a light emitting pixel unit and an ultraviolet emitting pixel according to the present invention.

Referring to FIG. 7, FIG. 7 is another schematic view of a controlling structure for a light emitting pixel unit and an ultraviolet emitting pixel according to the present invention. The OLED display device 20 has an ultraviolet power switch 71, wherein the ultraviolet power switch 71 is connected to the ultraviolet pixels P to independently control the switch of the ultraviolet light emitting pixels P. However, the other light emitting pixels R, G, B are still controlled through the gate driver and source driver. Apparently, in the present invention, the switch of the ultraviolet light emitting pixels P is directly controlled through the ultraviolet power switch 71. The starting voltage of the ultraviolet emitting light pixels P is around only 10 volts (V). While the starting voltage is decreased, the power consumption of the OLED display device 20 is significantly decreased, so that the power conversion efficiency (PCE) is increased.

The present invention further provides to a display device, wherein comprising OLED structure of the present invention, and the display device can be a cell phone or television. While applying to a cell phone, it not only can be a colorful display screen, but also emit ultraviolet light independently. Therefore, while emitting ultraviolet light, it is used to inspect counterfeit money and so; and while applied to a household television, the emitted ultraviolet lighting can even be used to disinfection.

In the present invention, the ultraviolet light emitting pixels and the other pixels are simultaneously formed in OLED display device, and conjugated with different controlling methods, so that the OLED display device not only can carry out colorful display or can be independently used as an ultraviolet light source, so that the function of OLED display device is expanded to increase experiences for users.

As described above, the present invention has been described with a preferred embodiment thereof and it is understood that many changes and modifications to the described embodiment can be carried out without departing from the scope and the spirit of the invention that is intended to be limited only by the appended claims.

What is claimed is:

1. An organic light emitting diode structure, comprising: a transparent substrate; and a plurality of row-arranged and column-arranged light emitting pixel units formed on the transparent substrate, and each of the light emitting pixel units comprising: a first light emitting pixel, a second light emitting pixel and a third light emitting pixel to provide a plurality of visible light, wherein the organic light emitting diode further comprises:
   ultraviolet emitting pixels constructed by a first electrode layer, an ultraviolet organic emitting layer and a second electrode layer deposited and stacked on the transparent substrate in turn for emitting ultraviolet light.

2. The organic light emitting diode structure according to claim 1, wherein the ultraviolet organic light emitting layer are filled with ultraviolet light emitting materials.

3. The organic light emitting diode structure according to claim 2, wherein ultraviolet light emitting materials are organic compounds of carbazoles, fluorenes, triphenylamines or quinquephenyls.

4. The organic light emitting diode structure according to claim 2, wherein materials of the transparent substrate are quartz glass or polymethylmethacrylate (PMMA).

5. The organic light emitting diode structure according to claim 1, wherein each of the light emitting pixel units is corresponding to one of the ultraviolet light emitting pixels, wherein
   in each of the light emitting pixel units, first light emitting pixel units, second light emitting pixel units and third light emitting pixel units are arranged along a direction of rows, the ultraviolet light emitting pixels are arranged along the same direction of the rows and parallel to the first, second and third light emitting pixels.

6. The organic light emitting diode structure according to claim 1, wherein each of the light emitting pixel units is corresponding to one of the ultraviolet light emitting pixels; a first light emitting pixel, a second light emitting pixel and a third light emitting pixel in each of the light emitting pixel units and the ultraviolet light emitting pixels form a square array.

7. The organic light emitting diode structure according to claim 1, wherein the ultraviolet light emitting pixels are parallel to the light emitting pixel units of each row.

8. The organic light emitting diode structure according to claim 1, wherein the transparent substrate is further formed with scan lines, data lines, power lines and switch array components thereon, the ultraviolet light emitting pixels are connected to the scan lines, the data lines and the power lines through the switch array components, and the ultraviolet light emitting pixels are switched based on signals of the scan lines, the data lines and the power lines.

9. The organic light emitting diode structure according to claim 1, wherein the organic light emitting diode comprises an ultraviolet power switch components for controlling to switch the ultraviolet light emitting pixels.

10. An organic light emitting diode structure, comprising: a transparent substrate; and a plurality of row-arranged and column-arranged light emitting pixel units formed on the transparent substrate, and the light emitting pixel units comprising a plurality of light emitting pixels to provide a plurality of visible lights, wherein the organic light emitting diode further comprises: ultraviolet light emitting pixels for emitting ultraviolet light.

11. The organic light emitting diode structure according to claim 10, wherein the ultraviolet light emitting pixels are constructed by a first electrode layer, an ultraviolet organic emitting layer and a second electrode layer deposited and stacked on the transparent substrate in turn, wherein the ultraviolet organic light emitting layer are filled with ultraviolet light emitting materials.

12. The organic light emitting diode structure according to claim 11, wherein ultraviolet light emitting materials are organic compounds of carbazoles, fluorenes, triphenylamines or quinquephenyls.

13. The organic light emitting diode structure according to claim 11, wherein materials of the transparent substrate are quartz glass or polymethylmethacrylate (PMMA).

14. The organic light emitting diode structure according to claim 10, wherein each of the light emitting pixel units comprises a first light emitting pixel, a second light emitting pixel and a third light emitting pixel, and each of the light emitting pixel units is corresponding to one of the ultraviolet light emitting pixels, wherein
   in each of the light emitting pixel units, first light emitting pixel units, second light emitting pixel units and third light emitting pixel units are arranged along a direction of rows, the ultraviolet light emitting pixels are arranged along the same direction of the rows and parallel to the first, second and third light emitting pixels.

15. The organic light emitting diode structure according to claim 10, wherein each of the light emitting pixel units comprises a first light emitting pixel, a second light emitting pixel and a third light emitting pixel, and each of the light emitting pixel units is corresponding to one of the ultraviolet light emitting pixels; the first, second and third light emitting pixels in each of the light emitting pixel units and the ultraviolet light emitting pixels form a square array.

16. The organic light emitting diode structure according to claim 10, wherein the ultraviolet light emitting pixels are parallel to the light emitting pixel units of each row.

17. The organic light emitting diode structure according to claim 10, wherein the transparent substrate is further formed with scan lines, data lines, power lines and switch array components thereon, the ultraviolet light emitting pixels are connected to the scan lines, the data lines and the power lines through the switch array components, and the ultraviolet light emitting pixels are switched based on signals of the scan lines, the data lines and the power lines.

18. The organic light emitting diode structure according to claim 10, wherein the organic light emitting diode comprises an ultraviolet power switch components for controlling to switch the ultraviolet light emitting pixels.

19. An organic light emitting diode display device, comprising: an organic light emitting diode structure, wherein the organic light emitting diode structure comprises a transparent substrate, and a plurality of row-arranged and column-arranged light emitting pixel units formed on the transparent substrate, wherein the light emitting pixel units comprises a plurality of light emitting pixels to provide a plurality of visible lights, wherein the organic light emitting diode further comprises: ultraviolet light emitting pixels for emitting ultraviolet light.

20. The organic light emitting diode display device according to claim 19, wherein the ultraviolet light emitting pixels are constructed by a first electrode layer, an ultraviolet organic emitting layer and a second electrode layer deposited and stacked on the transparent substrate in turn for emitting ultraviolet light, wherein the ultraviolet organic light emitting layer are filled with ultraviolet light emitting materials.

* * * * *